US012603117B2

(12) United States Patent
Zhu et al.

(10) Patent No.: US 12,603,117 B2
(45) Date of Patent: Apr. 14, 2026

(54) CROSSBAR CIRCUITS UTILIZING CURRENT-MODE DIGITAL-TO-ANALOG CONVERTERS

(71) Applicant: TetraMem Inc., Fremont, CA (US)

(72) Inventors: Hengfang Zhu, Fremont, CA (US); Gong Lei, Sunnyvale, CA (US)

(73) Assignee: TetraMem Inc., San Jose, CA (US)

( * ) Notice: Subject to any disclaimer, the term of this patent is extended or adjusted under 35 U.S.C. 154(b) by 143 days.

(21) Appl. No.: 18/316,946

(22) Filed: May 12, 2023

(65) Prior Publication Data

US 2024/0379140 A1 Nov. 14, 2024

(51) Int. Cl.
| | |
|---|---|
| *G11C 11/00* | (2006.01) |
| *G11C 7/16* | (2006.01) |
| *G11C 13/00* | (2006.01) |

(52) U.S. Cl.
CPC ........... *G11C 7/16* (2013.01); *G11C 13/0026* (2013.01); *G11C 13/0028* (2013.01); *G11C 2013/0054* (2013.01)

(58) Field of Classification Search
CPC ... G11C 7/16; G11C 13/0026; G11C 13/0028; G11C 2013/0054; G11C 11/54; G11C 13/004; G11C 2013/0071; G11C 13/003; G11C 2013/0078; G11C 2213/78; G11C 13/0069; G11C 2213/79
USPC ........................................................ 365/185
See application file for complete search history.

(56) References Cited

U.S. PATENT DOCUMENTS

| | | | |
|---|---|---|---|
| 9,455,014 B1 | 9/2016 | Lee et al. | |
| 11,705,196 B2 * | 7/2023 | Hu ....................... | G06F 9/30036 |
| | | | 365/148 |
| 2017/0206961 A1 | 7/2017 | Yoon | |
| 2020/0096564 A1 | 3/2020 | Ge | |
| 2020/0234763 A1 | 7/2020 | Ge | |
| 2021/0065793 A1 * | 3/2021 | Ge ..................... | G11C 13/0026 |
| 2021/0343320 A1 | 11/2021 | Horng et al. | |
| 2022/0077389 A1 * | 3/2022 | Zhang .................. | H10N 70/021 |

(Continued)

OTHER PUBLICATIONS

International Searching Authority (ISA)/US, International Search Report for PCT/US2024/028924, mailed Aug. 20, 2024, 2 pages.

(Continued)

*Primary Examiner* — Amir Zarabian
*Assistant Examiner* — Minh Dinh
(74) *Attorney, Agent, or Firm* — Jaffery Watson Hamilton & DeSanctis LLP

(57) ABSTRACT

The present disclosure relates to crossbar circuits utilizing resistive random-access memory (RRAM) devices. A crossbar circuit may include a plurality of word lines intersecting with a plurality of bit lines, and a plurality of cross-point devices. Each of the cross-point devices is connected to one of the word lines and one of the bit lines and includes a resistive random-access memory (RRAM) device. The crossbar circuit may further include one or more current digital-to-analog converters (IDACs) configured to perform digital-to-analog conversion. The IDACs are selectively connected to the word lines or the bit lines to provide programming signals to program the RRAM devices to predetermined conductance values. The IDACs may linearly control the compliance currents of the RRAM devices to program the RRAM devices to multiple linearly separated conductance values.

19 Claims, 6 Drawing Sheets

(56)         References Cited

U.S. PATENT DOCUMENTS

| | | |
|---|---|---|
| 2022/0293173 A1 | 9/2022 | Hu et al. |
| 2023/0113231 A1 | 4/2023 | Sarin |

OTHER PUBLICATIONS

International Searching Authority (ISA)/US, Written Opinion for PCT/US2024/028924, mailed Aug. 20, 2024, 6 pages.

\* cited by examiner

100

Wordline (WL) 215b

200b

201

D

G

203

Select Line
(SEL) 213

S

Bitline (BL) 211b

IDAC
220

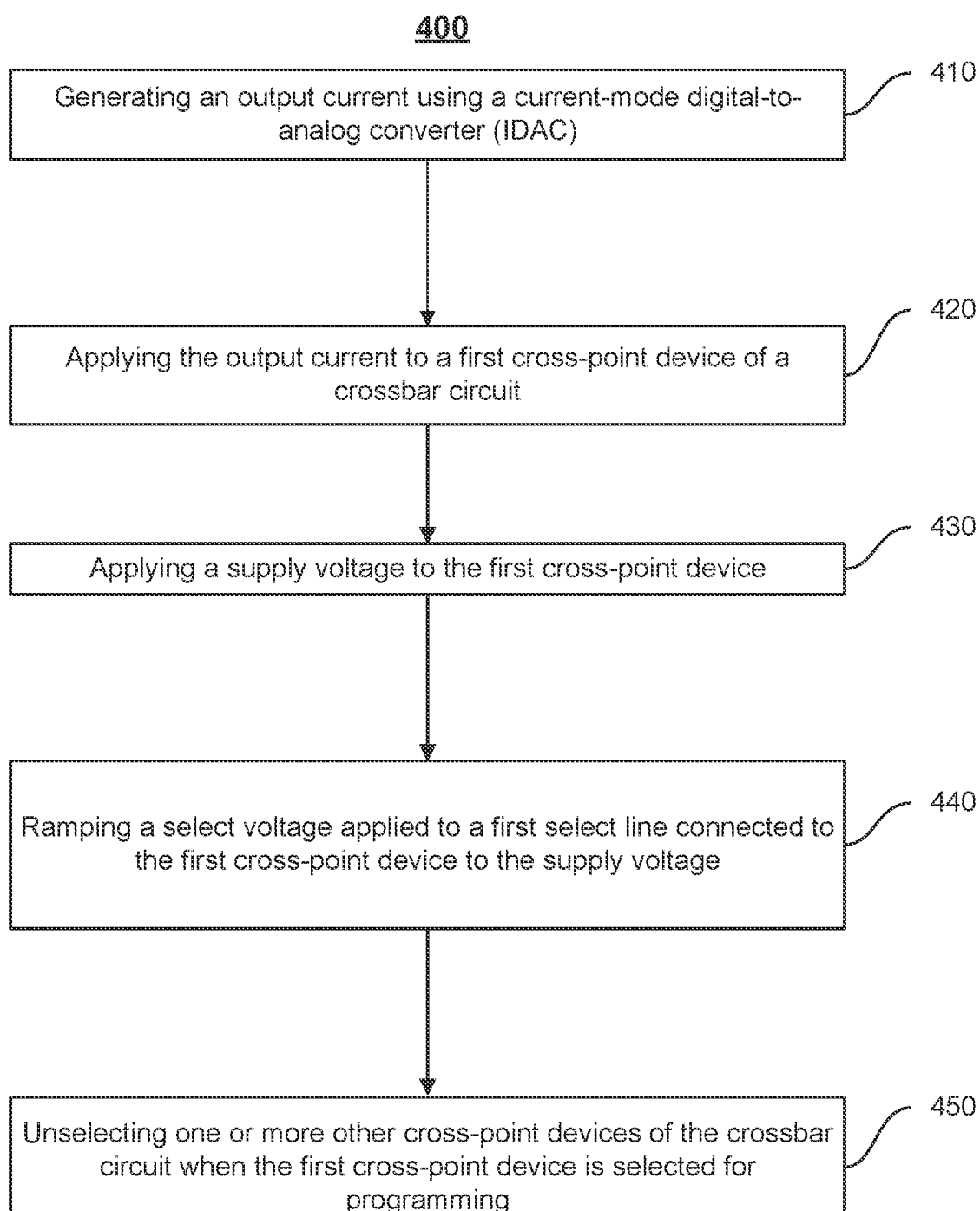

400

Generating an output current using a current-mode digital-to-analog converter (IDAC) — 410

Applying the output current to a first cross-point device of a crossbar circuit — 420

Applying a supply voltage to the first cross-point device — 430

Ramping a select voltage applied to a first select line connected to the first cross-point device to the supply voltage — 440

Unselecting one or more other cross-point devices of the crossbar circuit when the first cross-point device is selected for programming — 450

FIG. 4

CROSSBAR CIRCUITS UTILIZING CURRENT-MODE DIGITAL-TO-ANALOG CONVERTERS

TECHNICAL FIELD

The implementations of the disclosure relate generally to crossbar circuits including resistive random-access memory (RRAM) devices and, more specifically, to crossbar circuits utilizing current-mode digital-to-analog converters (IDACs).

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus is provided. The apparatus may include a plurality of word lines intersecting with a plurality of bit lines; a plurality of cross-point devices, wherein each of the cross-point devices is connected to one of the word lines and one of the bit lines, wherein each of the cross-point devices includes a resistive random-access memory (RRAM) device; and one or more current digital-to-analog converters (IDACs) configured to perform digital-to-analog conversion, wherein a first IDAC of the plurality of IDACs is selectively connected to a first word line of the plurality of word lines or a first bit line of the plurality of bit lines, and wherein an output current generated by the first IDAC is applied to the first word line or the first bit line.

In some embodiments, the first IDAC is configured to be connected to the first word line or the first bit line via a switch.

In some embodiments, the first IDAC is configured to receive a digital input and convert the digital input into the output current.

In some embodiments, the apparatus further includes a transistor serially connected to at least one RRAM device, wherein a gate terminal of the transistor is connected to a first select line.

In some embodiments, a source terminal of the transistor is connected to the first word line.

In some embodiments, a source terminal of the transistor is connected to the first bit line.

In some embodiments, the transistor is connected to a plurality of RRAM devices.

In some embodiments, the output current limits a compliance current of the first RRAM device.

According to one or more aspects of the present disclosure, a method for programming a crossbar circuit is provided. The method may include: generating a first output current using a current-mode digital-to-analog converter (IDAC); applying the first output current to a first cross-point device via a first word line or a first bit line connected to the first cross-point device, wherein the first cross-point device includes a first RRAM device; applying a supply voltage to the first cross-point device; and ramping a select voltage applied to a first select line connected to the first cross-point device, wherein the first RRAM device is programmed to a first conductance value in response to the application of the first output current.

In some embodiments, the select voltage is ramped from zero to the supply voltage.

In some embodiments, the method further includes providing a first digital input to the IDAC; and generating the first output current by performing digital-to-analog conversion on the first digital input.

In some embodiments, the method further includes connecting the IDAC to the first word line or the first bit line to apply the first output current to the first cross-point device.

In some embodiments, the method further includes generating a second output current using the IDAC; and applying the second output current to the first word line or the first bit line to program the first RRAM device to a second conductance value.

In some embodiments, the first output current is applied to the first cross-point device via the first word line, and wherein the supply voltage is applied to the first cross-point device via the first bit line.

In some embodiments, the method further includes setting a second word line to float.

In some embodiments, the first output current is applied to the first cross-point device via the first bit line, and wherein the supply voltage is applied to the first cross-point device via the first word line.

In some embodiments, the method further includes unselecting a second cross-point device while the first cross-point device is selected for programming, wherein the second cross-point device is connected to a second bit line, the first word line, and a second select line, and wherein the second cross-point device includes a second RRAM device.

In some embodiments, unselecting the second cross-point device further includes: applying a ground voltage to a second select line.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIGS. 3A and 3B are schematic diagrams illustrating example crossbar circuits and mechanisms for programming a crossbar circuit utilizing current-mode digital-to-analog converters in accordance with some embodiments of the present disclosure.

FIG. 4 is a flowchart of an example process for programming a crossbar array in accordance with some embodiments of the present disclosure.

DETAILED DESCRIPTION

Figure 1:
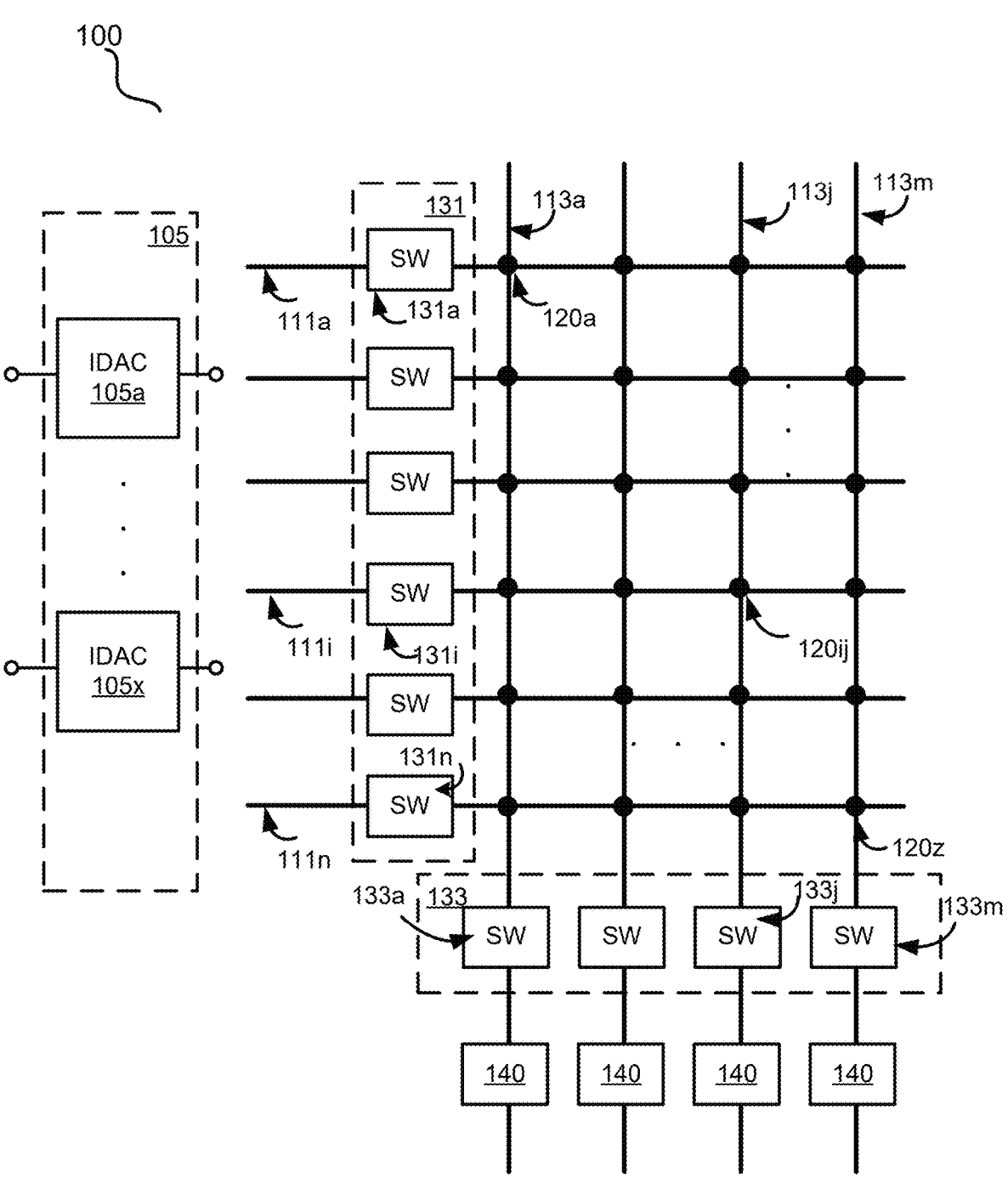
FIG. 1 is a diagram illustrating an example of a crossbar circuit in accordance with some embodiments of the present disclosure.

The present disclosure relates to crossbar circuits utilizing resistive random-access memory (RRAM) devices and current-mode digital-to-analog converters (IDACs), and mechanisms for programming crossbar circuits utilizing IDACs.

An RRAM device is a two-terminal passive device with programmable resistance. The RRAM device typically includes a first electrode, a second electrode, and a switching oxide layer positioned between the first electrode and the second electrode. The first electrode may include a non-reactive metal, such as platinum (Pt), palladium (Pd), etc. The second electrode may include a reactive metal, such as tantalum (Ta). The electrode including the non-reactive metal may also be referred to as the "non-reactive electrode." The electrode including the reactive metal may also be referred to as the "reactive electrode." The switching oxide layer may include a transition metal oxide, such as hafnium oxide ($HfO_x$) or tantalum oxide ($TaO_x$). After the reactive metal electrode is deposited on the switching oxide, the reactive metal can absorb oxygen from the switching oxide layer and create oxygen vacancies in the switching oxide layer, and oxygen ions can migrate in the switching oxide through a vacancy mechanism. During a forming process, a suitable programming signal may be applied to the RRAM device, which may cause a drift of oxygen ions to migrate from the switching oxide to the reactive electrode. As a result, a conductive filament may form through the switching oxide layer (e.g., from the reactive electrode to the non-reactive electrode). The RRAM device may then be reset to a high-resistance state by applying a reset signal (e.g., a voltage signal, a current signal) to the RRAM device. The application of the reset signal to the RRAM device may cause oxygen to migrate back to the switching oxide layer and may thus interrupt the conductive filament. The RRAM device may be electrically switched between a high-resistance state and a low-resistance state in response to the application of suitable programming signals. A forming process may refer to programming an RRAM device starting from the virgin state. The RRAM device may be programmed from the high resistance state to a lower resistance state in a setting process (also referred to as a "SET" operation). The RRAM device may be programmed from the low resistance state in a resetting process (also referred to as a "RESET" operation).

In existing crossbar array circuits, programming signals are typically provided to an RRAM device via a transistor connected to the RRAM device. The transistor functions as both a selector and a current controller. The transistor may set the compliance current of the RRAM device during the programming. In particular, the gate voltage on the transistor may set compliance currents to the RRAM device during the programming of the RRAM device and can thus control the conductance and analog behavior of the RRAM device. During a SET operation, a bit line connected to the RRAM device may be grounded. A word line connected to the RRAM device is driven by a unity gain buffer with a voltage digital-to-analog converter (VDAC) to control the output voltage and ramp the output voltage from 0 to a supply voltage. The select line connected to the RRAM device is also driven by a unity gain buffer with a VDAC to control the output voltage level from zero to the supply voltage. The application of the specific combination of voltages to the word line, the bit line, and the select line connected to the RRAM device may ensure a large enough voltage across the RRAM device to initiate the filament formation in the RRAM device in the forming process or setting process. It may further limit the current flowing through the RRAM device during the formation of the conductive filament formation. The conductance value of an RRAM device during a set operation is proportional to the compliance current through the RRAM device. As such, it might be desirable to linearly control the current flowing through the RRAM device to program the conductance of the RRAM device to linearly separated conductance values. However, current solutions for programming RRAM devices in a crossbar circuit typically program an RRAM device by linearly controlling the gate voltage of the transistor connected to the RRAM device, resulting in a parabolic relationship between the current passing through the RRAM device and the gate voltage. As such, it might be difficult to precisely control the programming voltages applied to the RRAM devices using the existing crossbar circuit. The issue is even more pronounced for smaller transistors, where the current limiting role of the transistor is further compromised in higher current level applications and due to severe channel length modulation effect.

To address the above and other deficiencies of the existing crossbar circuits, the present disclosure provides crossbar circuits using current-mode digital-to-analog converters (IDACs) to control the compliance currents of the RRAM devices of the crossbar circuits. In accordance with some embodiments of the present disclosure, a crossbar circuit may include a plurality of cross-point devices connecting to intersecting word lines and bit lines. Each of the cross-point devices may include at least one RRAM device. The crossbar circuit may further include one or more IDACs selectively connected to the word lines of the crossbar circuit. Each of the IDACs may convert digital input signals into analog output current signals that are linearly related to the digital input signals. The analog output current signals may be provided to one or more RRAM devices as programming currents to program the conductance values of the RRAM devices. For example, an IDAC of the crossbar circuit may be enabled and connected to a word line of the crossbar circuit to program a cross-point device connected to the word line. The IDAC may perform digital-to-analog conversion on a digital input and generate an output current that represents a programming current for programming the RRAM device in the cross-point devices to a predetermined conductance value. The output current may be applied to the cross-point device via the word line. During the programming of the cross-point device, a supply voltage may be applied to a bit line connected to the cross-point device. A select voltage may be applied to a select line connected to the cross-point device. The select line may be ramped from zero to the supply voltage. Due to the high output impedance at the IDAC output node, the SET operation may automatically stop when the voltage across the RRAM device is sufficiently low (e.g., lower than a switching voltage threshold). As the IDAC may provide linearly controlled output currents based on digital inputs (e.g., digital bits), it may provide programming signals that may program the RRAM device to linearly separated conductance values. Unlike the transistors in the existing crossbar circuits, a transistor in the crossbar circuit described herein functions as a switch for selecting one or more RRAM devices and does not control the programming voltages or currents for programming the RRAM devices. The mechanisms described herein may thus precisely control the desirable programming currents to be applied to the RRAM devices and achieve crossbar circuits with high linearity.

FIG. 1 is a diagram illustrating an example 100 of a crossbar circuit in accordance with some embodiments of the present disclosure. As shown, crossbar circuit 100 may include a plurality of interconnecting electrically conductive wires, such as one or more word lines 111*a*, . . . , 111*i*, . . . , 111*n*, and bit lines 113*a*, . . . 113*j*, . . . , 113*m* for an n-row by m-column crossbar array. The crossbar circuit 100 may further include cross-point devices 120*a*, . . . , 120*ij*, . . . 120*z*, etc. Each of the cross-point devices may connect a word line and a bit line. For example, the cross-point device 120*ij* may connect the word line 111*i* and the bit lines 113*j*. The number of the bit lines 113*a-m* and the number of the word lines 111*a-n* may or may not be the same.

Each cross-point device 120*a-z* may be and/or include any suitable device with programmable resistance, such as a phase-change memory (PCM) device, a floating gate device, a spintronic device, a ferroelectric device, an RRAM device, etc. Each cross-point device 120*a-z* may further include one or more transistors and may include an n-transistor-m-resistor (nTmR) configuration, where n and m denote the number of transistors and the number of programmable devices (e.g., RRAM devices) in the cross-point device, respectively. In some embodiments, one or more cross-point devices 120*a-z* may include a one-transistor-one-resistor (1T1R) configuration described in connection with FIGS. 2A-2B. In some embodiments, one or more cross-point devices 120*a-z* may be connected to one transistor to implement a 1TmR configuration.

Each of word lines 111*a-n* may be connected to one or more row switches 131 (e.g., row switches 131*a-n*). Each row switch 131 may include any suitable circuit structure that may control current flowing through word lines 111*a-n*.

Each of bit lines 113*a-m* may be connected to one or more column switches 133 (e.g., switches 133*a*, . . . , 133*j*, . . . , 133*m*). Each column switches 133*a-m* may include any suitable circuit structure that may control current passed through bit lines 113*a-m*. In some embodiments, one or more of switches 131*a-n* and 133*a-m* may further provide fault protection, electrostatic discharge (ESD) protection, noise reduction, and/or any other suitable function for one or more portions of crossbar circuit 100.

Crossbar circuit 100 may further include one or more IDACs 105 (e.g., IDAC 105*a*, . . . , IDAC 105*x*) that may be selectively connected to word lines 111*a-n* via row switches 131, or bit lines 113*a-m* via column switches 133. Crossbar circuit 100 may include any suitable number of IDACs for implementing various applications. Each IDAC 105 may be selectively connected to one or more switches 131*a*, . . . , 131*n*. Each IDAC 105 may also be selectively connected to one or more switches 133*a*, . . . , 133*m*. Each IDAC 105 may include any suitable circuitry for converting digital inputs into analog output currents linearly related to the digital inputs. The output currents may be programmable by setting the values of the digital inputs. Each IDAC 105 may be of N-bit resolution, where N is a positive integer. IDACs 105 may provide programming currents to one or more enabled cross-point devices 120*a-z* to program the enabled cross-point devices 120*a-z* to predetermined conductance values. For example, IDAC 105*a* may be connected to word line 111*i* via switch 131*i* to program cross-point device 120*ij*. Cross-point device 120*ij* may be enabled and programmed utilizing the programming schemes as described in connection with FIGS. 2A-4 below.

Output sensor(s) 140 may include any suitable component for converting the current flowing through bit lines 113*a-m* into digital outputs, such as one or more TIAs (trans-impedance amplifiers), analog-to-digital converters, etc. In some embodiments, output sensor(s) 140 may further include one or more multiplexers (not shown).

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. The cross-point devices may be programmed to the conductance values in the conductance matrix utilizing the IDACs and the programming schemes described herein. As such, the input signal is weighted at each of the cross-point devices by its conductance according to Ohm's law. The weighted current is output via each bit line and may be accumulated according to Kirchhoff's current law. This may enable in-memory computing (IMC) via parallel multiplications and summations performed in the crossbar arrays.

Crossbar circuit 100 may be configured to perform vector-matrix multiplication (VMM). A VMM operation may be represented as Y=XA, wherein each of Y, X, A represents a respective matrix. More particularly, for example, input vector X may be mapped to the input voltage V of crossbar circuit 100. Matrix A may be mapped to conductance values G. The output current I may be read and mapped back to output results Y. In some embodiments, crossbar circuit 100 may be configured to implement a portion of a neural network by performing VMMs.

Figure 2A:
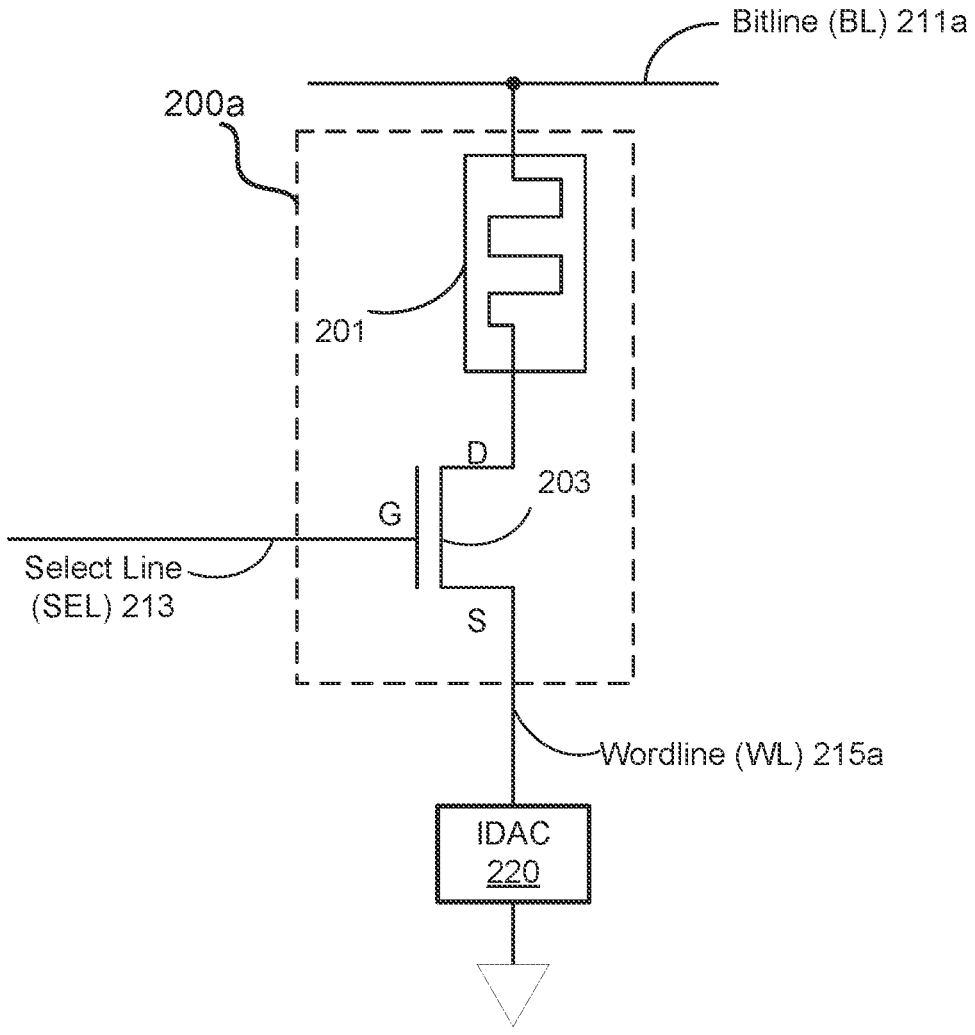
FIGS. 2A and 2B are schematic diagrams illustrating example cross-point devices in accordance with some embodiments of the present disclosure.
Figure 2B:
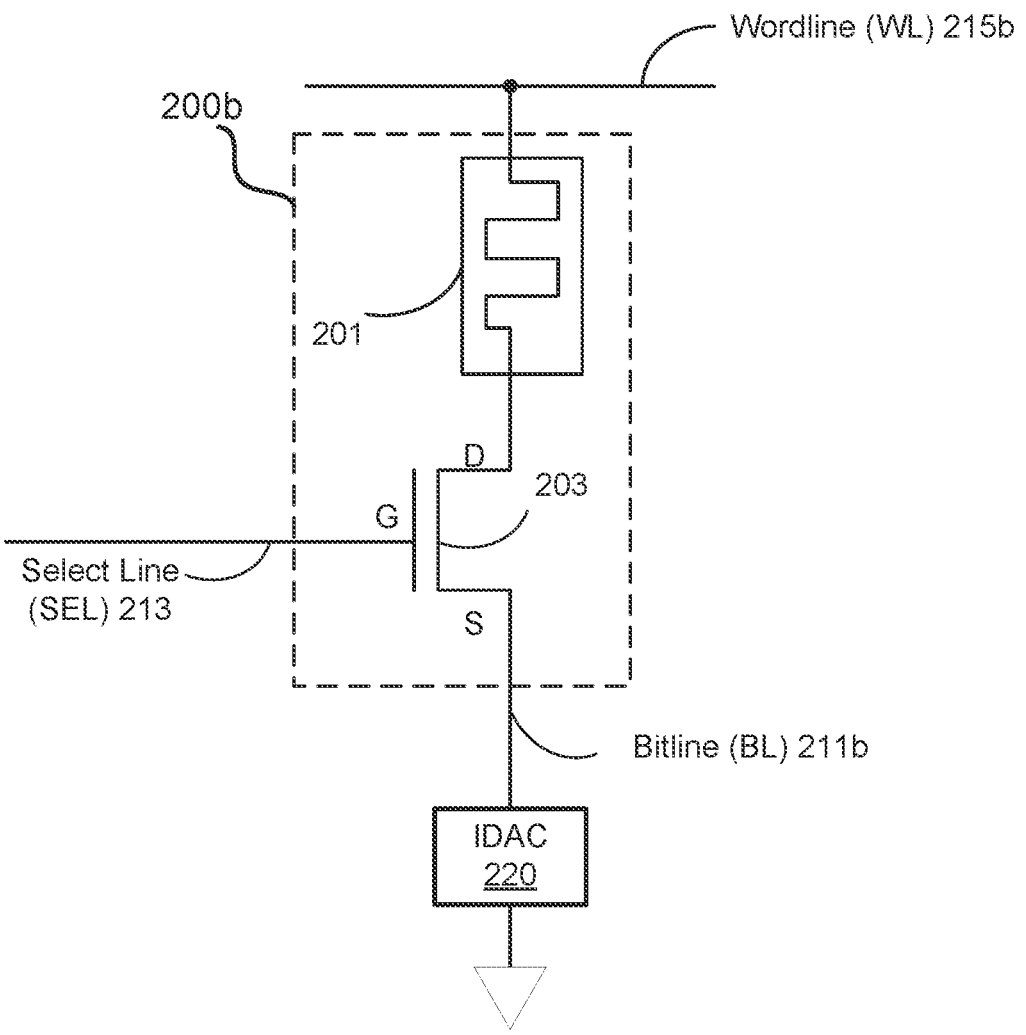

FIGS. 2A and 2B are schematic diagrams illustrating example cross-point devices 200*a* and 200*b* in accordance with some embodiments of the present disclosure. Each of cross-point devices 200*a* and 200*b* may be referred to as a 1-transistor-1-resistor (1T1R) configuration. As shown, each of cross-point devices 200*a* and 200*b* may be connected to a bit line (BL) 211*a* or 211*b*, a select line (SEL) 213, and a word line (WL) 215*a* or 215*b*. The bit line 211*a-b* and the word line 215*a-b* may be a bit line and a word line as described in connection with FIG. 1, respectively.

As shown in FIGS. 2A and 2B, a cross-point device 200*a-b* may include an RRAM device 201 serially connected to a transistor 203. A transistor may include three terminals that may be marked as gate (G), source(S), and drain (D), respectively. Referring to FIG. 2A, a first terminal of the RRAM device 201 may be connected to the drain terminal of transistor 203. A second terminal of RRAM device 201 may be connected to a bit line 211*a*. The source terminal of transistor 203 may be connected to a word line 215*a*. The gate terminal of transistor 203 may be connected to a select line 213.

IDAC 220 may convert a digital input into an analog output current and may provide linearly controlled output currents based on the digital input. IDAC 220 may produce an output current of a suitable current value for programming the RRAM device to a desirable conductance value. While being connected to word line 215*a*, IDAC 220 may set compliance currents to cross-point device 200*a* during the programming of cross-point device 200*a* and may thus control the conductance and analog behavior of cross-point device 200*a*. For example, programming the conductance of RRAM device 201 to a predetermined conductance value may involve connecting IDAC 220 to cross-point device 200*a* and providing a suitable digital input to IDAC 220. IDAC 220 may convert the digital input into an output current that corresponds to a programming current for programming the conductance of RRAM device 201 to the predetermined conductance value. The output current may be applied to RRAM device 201 via word line 215*a*. While RRAM device 201 and/or cross-point device 200*a* is programmed, bit line 211*a* may be connected to a supply voltage. A select voltage may be applied to select line 213 and the gate terminal of transistor 203. The select voltage may be ramped up from a low voltage (e.g., zero) to the supply voltage in a suitable period of time. Due to the high output impedance at the IDAC output node, a SET process may stop automatically when the voltage across the RRAM device is sufficiently high (e.g., greater than a switching voltage threshold). The voltage across RRAM device 201 may be automatically reduced when the conductance of RRAM device 201 approaches the predetermined conductance value. The programming process may then automatically stop after the conductance of RRAM device 201 reaches the predetermined conductance value. As the select voltage applied to the gate terminal of transistor 203 does not function as a programming voltage during the programming of RRAM device 201, transistor 203 functions as a switch for selecting and/or enabling RRAM device 201 and does not set the compliance current of RRAM device 201.

Referring to FIG. 2B, the second terminal of RRAM device 201 of cross-point device 200*b* may be connected to word line 215*b* in some embodiments. The source terminal of the transistor 203 of cross-point device 200*b* may be connected to bit line 211*b*. While being connected to bit line 211*b*, IDAC 220 may set compliance currents to cross-point device 200*b* during the programming of cross-point device 200*b* and may thus control the conductance and analog behavior of cross-point device 200*b*. For example, during a set operation or a form operation, word line 215*b* may be connected to the supply voltage VCC. IDAC 220 may convert a digital input into an output current that corresponds to a programming current for programming the conductance of RRAM device 201 to the predetermined conductance value. The output current may be applied to RRAM device 201 via bit line 211*b*.

Figure 3A:
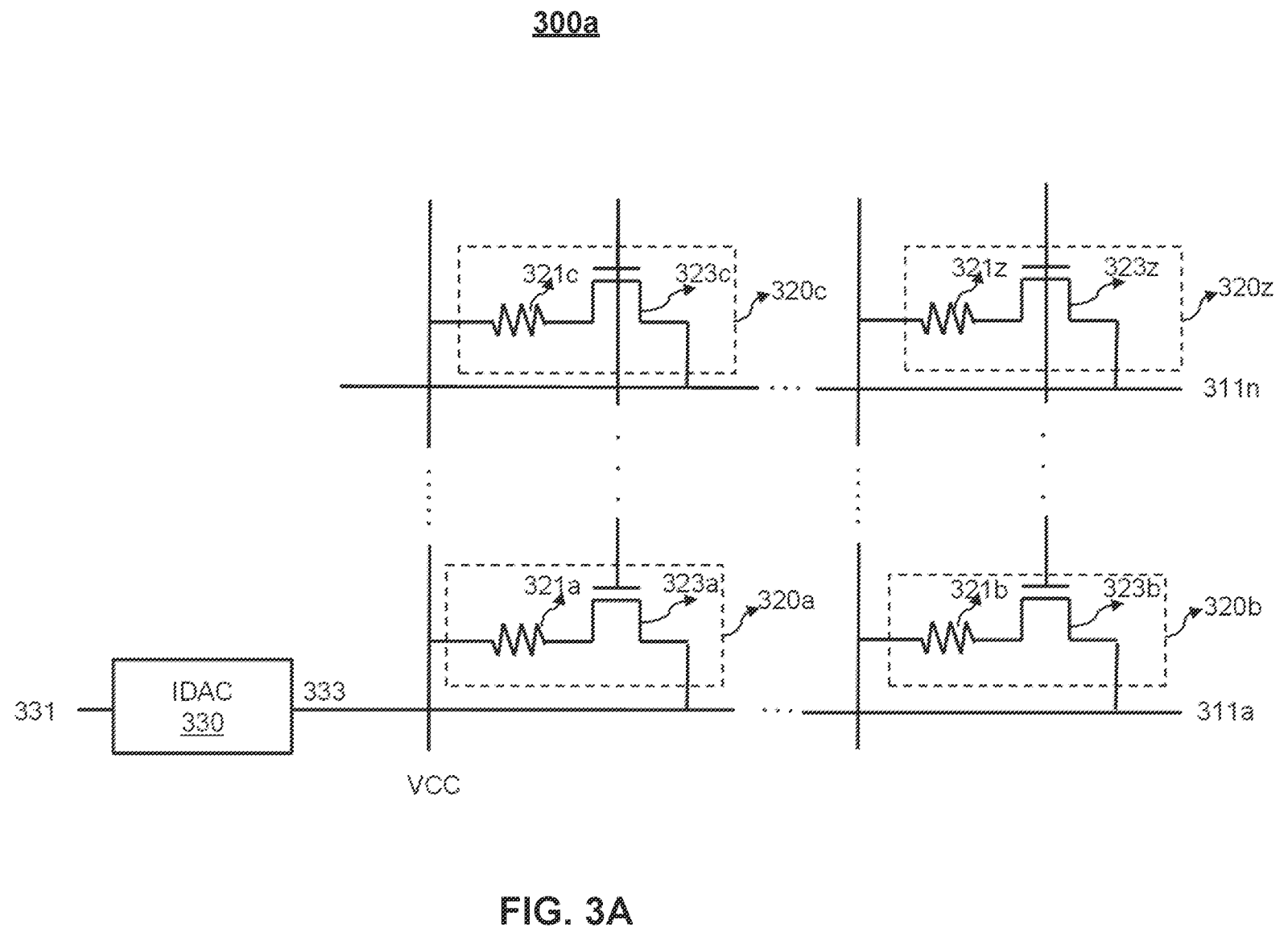
Figure 3B:
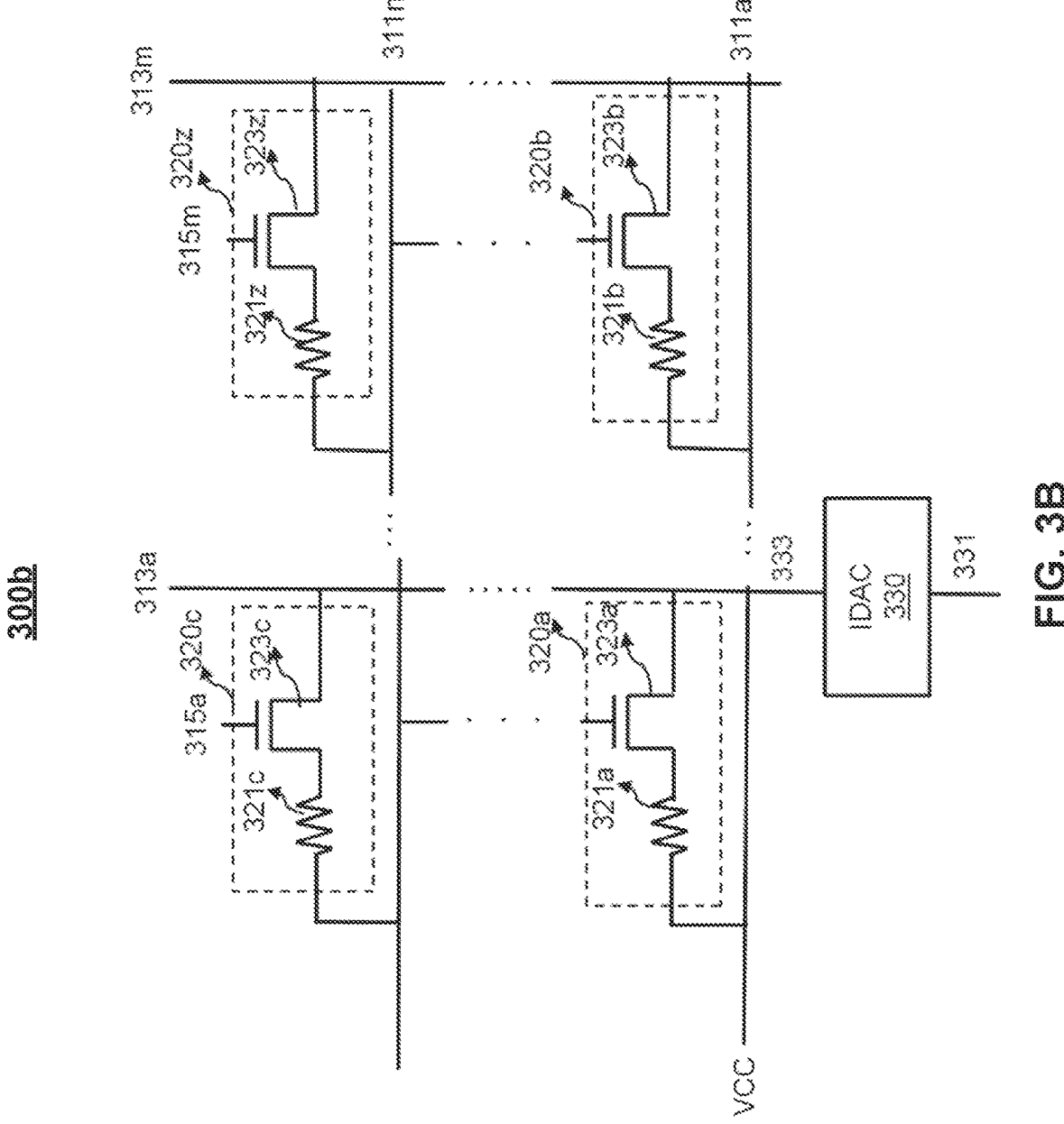

FIGS. 3A and 3B are schematic diagrams illustrating example crossbar circuits 300*a* and 300*b* and mechanisms for programming a crossbar circuit utilizing IDACs in accordance with some embodiments of the present disclosure.

As shown, each of crossbar circuit 300*a* and crossbar circuit 300*b* may include word lines 311*a*, . . . , 311*n*, bit lines 313*a*, . . . , 313*m*, cross-point devices 320*a-z*, and select lines 315*a*, . . . , 315*n*. Each cross-point device 320*a-z* may be connected to a word line 311*a-n*, a bit line 313*a-m*, and a select line 315*a-n*. In some embodiments, each cross-point device 320*a-z* may include a transistor 323*a-z* and an RRAM device 321*a*, 321*b*, . . . , 321*c*, . . . , 321*z* connected in series (e.g., a 1T1R configuration described in connection with FIGS. 2A and/or 2B). In some embodiments, the gate terminal of a transistor 323*a*, 323*b*, . . . , 323*c*, . . . , 323*z* may be connected to a respective select line 315*a-m*.

One or more cross-point devices 320*a-z* may be enabled and programmed to predetermined conductance values. For example, a first cross-point device 320*a* as illustrated in FIGS. 3A-3B may be selected and/or enabled for programming. As shown, first cross-point device 320*a* may be connected to a first word line 311*a*, a first bit line 313*a*, and a select line 315*a*. Referring to FIG. 3A, first word line 311*a* and first bit line 313*a* may be connected to an output of IDAC 330 and a supply voltage (e.g., supply voltage VCC as shown in FIG. 3A), respectively, to program the first cross-point device 320*a*. In some embodiments, first word line 311*a* may be connected to IDAC 330 via a row switch (not shown in FIG. 3A), such as a row switch 131 as described in connection with FIG. 1. A digital input 331 may be provided to IDAC 330 to generate an output current 333. Output current 333 may be applied to first cross-point device 320*a* and/or first RRAM device 321*a* to program first RRAM device 321*a* to a predetermined conductance value. Enabling and selecting the first cross-point device 320*a* may further involve applying a select voltage to first select line 315*a* and ramping the select voltage to the supply voltage.

In some embodiments, one or more other cross-point devices connected to first word line 311*a* are not selected for programming while the first cross-point device 320*a* is enabled and programmed. For example, a second cross-point device 320*b* is not enabled or selected for programming while the first cross-point device 320*a* is selected. In such embodiments, a second select line 315*m* that is connected to the second cross-point device 320*b* may be connected to ground. In some embodiments, the cross-point devices connected to a second word line 311*n* are not enabled or selected for programming while the first cross-point device 320*a* is enabled. In such embodiments, the second word line 311*n* may be set to float.

Referring to FIG. 3B, each cross-point device 320*a-z* may include a cross-point device 200*b* as described in connection with FIG. 2B in some embodiments. More particularly, for example, the RRAM device in a cross-point device 320*a-z* may be connected to a word line 311*a-n*. The source of the transistor in a cross-point device 320*a-z* may be connected to a bit line 313*a-n*. First bit line 313*a* and first word line 311*a* may be connected to an output of IDAC 330 and a supply voltage, respectively, to program the first cross-point device 320*a*. The output current 333 of IDAC 330 may be applied to the first cross-point device 320*a* and/or first RRAM device 321*a* to program first RRAM device 321*a* to the predetermined conductance value. In some embodiments, first bit line 313*a* may be connected to IDAC 330 via a column switch (not shown in FIG. 3B), such as a row switch 133 as described in connection with FIG. 1. Enabling and selecting the first cross-point device 320*a* may further involve applying a select voltage to first select line 315*a* and ramping the select voltage to the supply voltage.

One or more other cross-point devices connected to first word line 311*a* may be unselected and/or deactivated for programming while the first cross-point device 320*a* is enabled and programmed. For example, the second cross-point device 320*b* may be unselected and/or deactivated for programming by setting the select line 315*m* to ground. In some embodiments, one or more cross-point devices that are not connected to the first word line 311*a* are not selected for programming. For example, the cross-point devices connected to the second word line 311*n* are not enabled or selected for programming while the first cross-point device 320a is enabled. In such embodiments, the second word line 311n may be set to float.

FIG. 4 is a flowchart of an example process 400 for programming a crossbar array in accordance with some embodiments of the present disclosure. Process 400 may be executed to program one or more cross-point devices and/or RRAM devices as described in connection with FIGS. 1-3B.

At block 410, an output current may be generated using a current-mode digital-to-analog converter (IDAC). For example, a digital input may be provided to the IDAC. The IDAC may generate the output current by performing digital-to-analog conversion on the digital input. The output current may be a programming current that may cause the first RRAM device to be programmed to a predetermined conductance value. The digital input may be of a suitable value for producing the programming current. For example, a first output current may be generated by performing DAC on a first digital input for programming a cross-point device to a first predetermined value.

At block 420, the output current may be applied to a first cross-point device of the crossbar circuit of the crossbar circuit via a first word line or a first bit line connected to the first cross-point device. For example, the first word line or the first bit line may be connected to the output of the IDAC to receive the output current produced by the IDAC. In some embodiments, the first word line or the first bit line may be connected to the IDAC via a switch (e.g., a row switch 131 or a column switch 133 of FIG. 1).

At block 430, a supply voltage may be applied to the first cross-point device. The supply voltage may be, for example, a supply voltage as described in connection with FIGS. 2A-3B. The supply voltage may be applied to the first cross-point device via the first word line or the first bit line. In some embodiments, the output current of the IDAC and the supply voltage may be applied to the first cross-point device via the first word line and the first bit line, respectively. In some embodiments, the output current of the IDAC and the supply voltage may be applied to the first cross-point device via the first bit line and the first word line, respectively.

At block 440, a select voltage may be applied to a first select line that is connected to the first cross-point device and may be ramped to the supply voltage. In some embodiments, the first RRAM device is connected to a transistor. A gate terminal of the transistor may be connected to the first select line. The select voltage may thus be applied to the transistor via the first select line. In some embodiments, the select voltage applied to the first select line may be ramped from zero or any other suitable voltage that is lower than the supply voltage to the supply voltage.

In some embodiments, while the first cross-point device (e.g., cross-point device 320a of FIGS. 3A and/or 3B) is enabled and selected for programming as described above, one or more other cross-point devices of the crossbar circuit may be unselected and deactivated for programming or in-memory computing at block 450. For example, a cross-point device may be unselected and/or deactivated by setting a word line connected to the unselected cross-point device to float, connecting a select line connected to the unselected cross-point device to ground, and/or setting a bit line connected to the unselected cross-point device to float or another voltage (e.g., a ground supply). In some embodiments in which the output current of the IDAC is applied to the first cross-point device via the first word line, a second cross-point device (e.g., cross-point device 320b of FIG. 3A) that is connected to the first word line and a second bit line may be unselected and deactivated by connecting a second select line that is connected to the second cross-point device to ground. In such embodiments, the cross-point devices that are not connected to the first word line may be unselected and deactivated by setting the word line(s) connected to the cross-point devices to float. For example, a third cross-point device (e.g., cross-point device 320c of FIG. 3A) that is connected to the first select line, a second word line, and the first bit line may be unselected and deactivated by setting the second word line to float. As a result, a fourth cross-point device (e.g., cross-point device 320z of FIG. 3A) that is connected to the second word line, the second bit line, and the second select line is unselected and deactivated.

In some embodiments in which the output current of the IDAC is applied to the first cross-point device via the first bit line, the second cross-point device (e.g., cross-point device 320b of FIG. 3B) may be unselected by applying a ground voltage to the select line that is connected to the second cross-point device. In such embodiments, one or more cross-point devices that are not connected to the first word line may be unselected and deactivated by setting the word lines(s) to float. For example, the third cross-point device (e.g., cross-point device 320c of FIG. 3B) and the fourth cross-point device (e.g., cross-point device 320z of FIG. 3B) may be unselected and deactivated by applying the supply voltage to the second word line (e.g., word line 311n of FIG. 3B).

In some embodiments, process 400 may be executed in an iterative manner to program the first RRAM device to multiple resistance levels. For example, a second output current may be generated using the IDAC and applied to the first word line to program the first RRAM device to a second conductance value. The second output current may be a second programming current that may be used to program the first RRAM device to a second conductance value. More particularly, for example, a second digital input may be provided to the IDAC to generate the second output current.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
a plurality of word lines intersecting with a plurality of bit lines;
a plurality of cross-point devices, wherein each of the cross-point devices is connected to one of the word lines and one of the bit lines, wherein each of the cross-point devices comprises a resistive random-access memory (RRAM) device; and
one or more current digital-to-analog converters (IDACs) configured to perform digital-to-analog conversion, wherein a first IDAC of the one or more IDACs is selectively connected to a first word line of the plurality of word lines or a first bit line of the plurality of bit lines, and wherein an output current generated by the first IDAC is applied to the first word line or the first bit line.

2. The apparatus of claim 1, wherein the first IDAC is configured to be connected to the first word line or the first bit line via a switch.

3. The apparatus of claim 1, wherein the first IDAC is configured to receive a digital input and convert the digital input into the output current.

4. The apparatus of claim 1, further comprising a transistor serially connected to at least one RRAM device, wherein a gate terminal of the transistor is connected to a first select line.

5. The apparatus of claim 4, wherein a source terminal of the transistor is connected to the first word line.

6. The apparatus of claim 4, wherein a drain terminal of the transistor is connected to the first bit line.

7. The apparatus of claim 4, wherein the transistor is connected to a plurality of RRAM devices.

8. The apparatus of claim 1, wherein the output current limits a compliance current of a first RRAM device in a first cross-point device connected to the first word line.

9. A method for programming a crossbar circuit, comprising:
generating a first output current using a current-mode digital-to-analog converter (IDAC);
applying the first output current to a first cross-point device via a first word line or a first bit line connected to the first cross-point device, wherein the first cross-point device comprises a first RRAM device;
applying a supply voltage to the first cross-point device; and
ramping a select voltage applied to a first select line connected to the first cross-point device, wherein the first RRAM device is programmed to a first conductance value in response to the application of the first output current.

10. The method of claim 9, wherein the select voltage is ramped from zero to the supply voltage.

11. The method of claim 9, further comprising:
providing a first digital input to the IDAC; and
generating the first output current by performing digital-to-analog conversion on the first digital input.

12. The method of claim 11, further comprising: connecting the IDAC to the first word line or the first bit line to apply the first output current to the first cross-point device.

13. The method of claim 11, further comprising:
generating a second output current using the IDAC; and
applying the second output current to the first word line or the first bit line to program the first RRAM device to a second conductance value.

14. The method of claim 9, wherein the first output current is applied to the first cross-point device via the first word line, and wherein the supply voltage is applied to the first cross-point device via the first bit line.

15. The method of claim 14, further comprising:
setting a second word line to float.

16. The method of claim 9, wherein the first output current is applied to the first cross-point device via the first bit line, and wherein the supply voltage is applied to the first cross-point device via the first word line.

17. The method of claim 16, further comprising:
setting a second word line to float.

18. The method of claim 9, further comprising unselecting a second cross-point device while the first cross-point device is selected for programming, wherein the second cross-point device is connected to a second bit line, the first word line, and a second select line, and wherein the second cross-point device comprises a second RRAM device.

19. The method of claim 18, wherein unselecting the second cross-point device further comprises:

applying a ground voltage to the second select line.

\*   \*   \*   \*   \*